(12) United States Patent
Matsumoto

(10) Patent No.: US 6,514,856 B2
(45) Date of Patent: Feb. 4, 2003

(54) METHOD FOR FORMING MULTI-LAYERED INTERCONNECT STRUCTURE

(75) Inventor: Akira Matsumoto, Tokyo (JP)

(73) Assignee: NEC Corporation, Tokyo (JP)

( * ) Notice: Subject to any disclaimer, the term of this patent is extended or adjusted under 35 U.S.C. 154(b) by 52 days.

(21) Appl. No.: 09/784,267

(22) Filed: Feb. 15, 2001

(65) Prior Publication Data

US 2001/0027002 A1 Oct. 4, 2001

(30) Foreign Application Priority Data

Feb. 15, 2000 (JP) ........................................ 2000-036149

(51) Int. Cl.[7] .......................................... H01L 21/4763
(52) U.S. Cl. ...................... 438/637; 438/622; 438/624; 438/629; 438/634; 438/638; 438/672
(58) Field of Search ................................. 438/618, 622, 438/624, 625, 627, 629, 634, 637, 638, 642, 643, 652, 653, 666, 668, 672, 700, 706, 710, 711, 717, 737; 257/758, 760

(56) References Cited

U.S. PATENT DOCUMENTS

| | | | | |
|---|---|---|---|---|
| 5,635,423 A | * | 6/1997 | Huang et al. | 438/638 |
| 5,705,430 A | * | 1/1998 | Avanzino et al. | 438/618 |
| 5,821,603 A | * | 10/1998 | Puntambekar | 257/640 |
| 6,042,999 A | * | 3/2000 | Lin et al. | 430/316 |
| 6,057,239 A | * | 5/2000 | Wang et al. | 438/689 |
| 6,319,815 B1 | * | 11/2001 | Iguchi et al. | 438/624 |
| 6,362,093 B1 | * | 3/2002 | Jang et al. | 438/633 |
| 6,426,298 B1 | * | 7/2002 | Chen et al. | 438/699 |

FOREIGN PATENT DOCUMENTS

JP          10-223755          8/1998

OTHER PUBLICATIONS

Umezawa Tadashi (JP 10–223755) (Machine Translation).*
DaTasha Harris Dow Expands Line of SILK Resins with "Self–Priming" Low–k material, Jun. 2000, The Dow Chemical Company. pp. 1–2.*
Kuk–Han Yoon et al. High aspect Ratio Via Etching for Dual Damascene process in an Inductively Coupled Plasma (ICP) Etcher, 1999, IEEE, pp. 155–158.*
H.W. Thompson et al. "Etch Process Development for FLARE for Dual Damascene Architecture using N2/O2 Plasma", 1999, IEEE, pp. 59–61.*

* cited by examiner

Primary Examiner—Carl Whitehead, Jr.
Assistant Examiner—Maria Guerrero
(74) Attorney, Agent, or Firm—Scully, Scott, Murphy & Presser

(57) ABSTRACT

A method for forming a multi-layered interconnect structure including an underlying interconnect, an overlying interconnect and a conductive via-plug for connecting the both interconnects, wherein a through-hole is filled with a protective film plug, and during the etching of the protective film and the protective film plug, a top surface of the protective film plug in the through-hole is placed lower than a top surface of the second dielectric film. In accordance with the present invention, the multi-layered interconnect structure having a smaller connection resistance and smaller dimensions can be obtained.

9 Claims, 10 Drawing Sheets

METHOD FOR FORMING MULTI-LAYERED INTERCONNECT STRUCTURE

BACKGROUND OF THE INVENTION (a) Field of the Invention

The present invention relates to a multi-layered interconnect structure and a method for forming the same, especially to the multi-layered interconnect structure having a reduced connection resistance and smaller dimensions and the method for forming the same.

(b) Description of the Related Art

The development of the interconnect structure with smaller dimensions is necessary for achieving the higher integration in the semiconductor device. As a method for forming such an interconnect structure, a so-called dual-damascene technology which is developed by improving an embedded damascene technology attracts more and more attention.

In the dual-damascene technology, a multi-layered interconnect structure is formed including an underlying interconnect layer, an overlying interconnect layer and conductive via-plugs penetrating the interlayer dielectric film for connecting both the interconnect layers.

In the conventional damascene technology, as shown in FIG. 1A, after a dielectric film 14 such as a silicon dioxide ($SiO_2$) film is formed overlying a semiconductor substrate 12, an underlying interconnect 16 is formed in the trench of the dielectric film 14 by using the damascene technology. The underlying interconnect 16 includes a barrier metal layer 16a formed by a material such as TiN and a main interconnect 16b formed by a material such as Cu.

For forming the underlying interconnect 16, at first, a photoresist film not shown in the drawings is formed on the dielectric film 14. Then, after an etching mask having a trench pattern for interconnect trenches is formed by photolithographically patterning the photoresist film, the dielectric film 14 is etched by the anisotropic dry etching technology to form the interconnect trenches in the dielectric film 14.

Next, the barrier metal layer 16a and then the main interconnect 16b are deposited on the dielectric film 14 and simultaneously fill the inner spaces of the interconnect trenches.

The underlying interconnect 16 embedded in the interconnect trench of the dielectric film 14 as shown in FIG. 1A is formed by removing the unnecessary Cu layer 16b and barrier metal layer 16a on the dielectric film 14 by using a CMP (chemical mechanical polishing) process.

Then, in order to prevent the outward diffusion of the Cu in the embedded underlying interconnect 16, a SiN film 18 is formed overlying the entire surface of a wafer or on the dielectric film 14 and the underlying interconnect 16 as shown in FIG. 1B.

Thereafter, a $SiO_2$ film 20 acting as an interlayer dielectric film, a SiON film 22 acting as an etch stop layer, and a $SiO_2$ film 24 acting as a dielectric film for filling an overlying interconnect are sequentially formed on the entire surface of the wafer.

Then, a photoresist film is formed on the $SiO_2$ film 24 to form an etching mask 26 having a pattern for a through-hole 28 in which the conductive via-plug is formed. Next, the $SiO_2$ film 24, the SiON film 22 and the $SiO_2$ film 20 are etched by using the anisotropic dry etching technology to form the through-hole 28 which exposes the SiN film 18 as shown in FIG. 1C. Then, after the removal of the etching mask 26, as shown in FIG. 1D, another photoresist film is deposited on the entire wafer surface to form an etching mask 32 having a pattern of interconnect trenches for the overlying interconnect in communication with the through-hole 28.

A part of the $SiO_2$ film 24 uncovered with the etching mask 32 is etched by using the anisotropic dry etching technology to form an interconnect trench 34 as shown in FIG. 1E. The etching for forming the interconnect trench 34 is stopped by the SiON film 22 acting as the etch stop layer.

Then, as shown in FIG. 1F, the underlying interconnect 16 is exposed by the successive removals of the etching mask 32, the exposed SiON film 22 and the SiN film 18.

Next, a barrier metal layer 36a formed by a TiN film and a main interconnect layer 36b formed by Cu is formed on the entire wafer surface, thereby filling the through-hole 28 and the interconnect trench 34.

The unnecessary barrier metal layer 36a and main interconnect layer 36b on the $SiO_2$ film 24 is removed by using the CMP process, thereby, as shown in FIG. 1H, forming a conductive via-plug 38 in the through-hole 28 and an overlying interconnect 36 in the interconnect trench 34.

In this manner, the multi-layered interconnect structure including the underlying interconnect 16 and the overlying interconnect connected to the underlying interconnect 16 through intermediary of the conductive via-plug 38 can be formed by using the dual-damascene technology which includes a less number of steps than the damascene technology.

However, the conventional dual-damascene technology includes the following problems.

A first problem is that, as shown in FIG. 2A, the inner wall of the through-hole 56 formed in the preceding step is simultaneously etched when the interconnect trench 54 is formed, thereby increasing the diameter of the through-hole 56. The increase of the diameter is a bar to the smaller dimensions and the higher integration of the interconnect structure.

A second problem is that, as shown in FIG. 2A, the SiN film 48 covering the underlying interconnect 46 is simultaneously etched, when the interconnect trench 54 is formed, to expose the underlying interconnect 46. As a result, when the etching mask 52 used for forming the interconnect trench 54 is removed by using an $O_2$-ashing process, the underlying interconnect 46 is simultaneously oxidized to increase the connection resistances of the conductive via-plug and the underlying interconnect 46.

A third problem is that, as shown in FIG. 2B, the thickness of the photoresist film deposited for forming the etching mask 74 is reduced, during the formation of the interconnect trench 76, in the region where the through-holes 78 are densely formed due to the influence of the concave shape of the through-holes 78, thereby disabling the formation of the interconnect trench 76 having the precise dimensions.

JP-A-10(1998)-223755 describes a method for preventing the increase of the parasitic capacity of the overlying interconnect or the underlying interconnect, and the increase of the size of the through-hole by utilizing an organic film.

As shown in FIG. 3A illustrating another conventional dual-damascene technology recited in the above publication, after the formation of an underlying interconnect 44 overlying a substrate 42, a first $SiO_2$ film 46 and a SiN film are sequentially deposited overlying the substrate 42, and the SiN film is etched to form an etching mask 48 having a pattern for through-holes.

Then, as shown in FIG. 3A, after the successive formation of a second $SiO_2$ film 50 and an etching mask 52 formed by a photoresist film, the second $SiO_2$ film 50 is etched by using the etching mask 52 to form an interconnect trench 54 of an overlying interconnect. Further, the first $SiO_2$ film 46 is etched by using the etching mask 48 to form a through-hole 56.

Next, though not shown in the drawings, after the removal of the etching mask 52, a metal film is deposited to fill the through-hole 56 and the interconnect trench 54, and the metal film on the second $SiO_2$ film 50 is removed by using the CMP technique, thereby forming a conductive via-plug having the filled through-hole 56 and an overlying interconnect having the filled interconnect trench 54.

According to the technique described in the above publication, however, the SiN film used as the etching mask 48 and existing between the first $SiO_2$ film 46 and the second $SiO_2$ film 50 increases the parasitic capacity of the interconnect, and the periphery of the aperture of the etching mask 48 is also etched when the first $SiO_2$ film 46 is etched to enlarge the diameter of the through-hole 56.

In accordance with the improved process described in the above publication, as shown in FIG. 3B, an underlying interconnect 66 is deposited on a dielectric film formed on a substrate 62, and after the formation of a $SiO_2$ film 68, a through-hole 70 is formed therein. Then, after an organic applied film 72 having similar composition to that of a reflection preventing film is formed on the entire surface of the wafer, an etching mask 74 formed by a photoresist mask is formed. In this case, the organic applied film 72 is selected such that the etching rate thereof is smaller than that of the $SiO_2$ film 68.

The organic applied film 72 and the $SiO_2$ film 68 exposed to the aperture pattern of the etching mask 74 are etched to form an interconnect trench 76, and the through-hole 70 is filled and simultaneously a via-plug 78 formed by the organic applied film 72 and projecting from the bottom of the interconnect trench 76 is formed by utilizing the difference between the etching rates.

The successive and simultaneous removal of the etching mask 74 and the via-plug 78 formed by the organic applied film 72 conducted by the ashing treatment provides the through-hole 70 and the interconnect trench 76 having the desired dimensions, which are filled with a metal to form a multi-layered interconnect structure having a smaller parasitic capacity.

However, in accordance with experiments conducted by the present inventor, a carbon-based material generated in the etching gas during the etching and the dielectric material in the dielectric film to be etched form a mixture. As shown in FIG. 4A, the mixture is deposited, as a deposit 80, on the sidewalls of the via-plug 78 projected from the trench bottom.

Even after the ashing treatment, as shown in FIG. 4B, the deposit 80 having a cylindrical shape remains on the bottom of the interconnect trench 76. Accordingly, when the through-hole 70 and the interconnect trench 76 are filled with a metal to form the conductive via-plug and the overlying interconnect, the connection resistances of the through-hole 70 and the interconnect trench 76 increase, or the through-hole 70 is not smoothly filled.

The present inventor has obtained a concept that two-step etching including a protective film etching step (first protective film etching step) and a dielectric film and protective film etching step (second protective film etching step) having etching conditions different from each other places a top surface of the protective film plug filled in a through-hole lower than the bottom of an interconnect trench when the through-hole is filled with the protective film plug for protecting the through-hole, and has conducted repeated experiments, thereby reaching to the present invention.

SUMMARY OF THE INVENTION

In view of the foregoing, an object of the present invention is to provide a method for forming a multi-layered interconnect structure having a smaller connection resistance and smaller dimensions.

Thus, the present invention provides a method for forming a multi-layered interconnect structure including an underlying interconnect and an overlying interconnect including the steps of: depositing the underlying interconnect overlying a substrate; depositing a first dielectric film, an etch stop layer and a second dielectric film; forming a through-hole penetrating the second dielectric film, the etch stop layer and the first dielectric film to expose the underlying interconnect; depositing a protective film on the second dielectric film to fill the through-hole with the protective film; depositing an etching mask having pattern for the overlying interconnect; etching the protective film under the etching mask to expose the second dielectric film such that an etching rate of the protective film is larger than that of the second dielectric film, thereby placing a top surface of the protective film in the through-hole lower than a top surface of the second dielectric film; etching the second dielectric film and the protective film exposed through the pattern of the etching mask to leave part of the protective film in the through-hole such an etching rate of the protective film is not larger than that of the second dielectric film, thereby forming an interconnect trench of the overlying interconnect; removing the etching mask and the protective film on the second dielectric film, and the protective film in the through-hole; filling the through-hole and the interconnect trench with a metal or alloy to form a conductive via-plug for connecting the underlying interconnect and the overlying interconnect.

In accordance with the present invention, since the most part of the through-hole is filled with the protective film plug, the sidewalls of the through-hole are hardly etched, thereby preventing the increase of the aperture diameter. Further, also in the region where the through-holes are densely formed, the thinning of the photoresist film does not occur. Moreover, since the underlying interconnect is not exposed before the final step of removing the protective film plug in the through-hole, the oxidation of the underlying interconnect can be prevented.

The above and other objects, features and advantages of the present invention will be more apparent from the following description.

PREFERRED EMBODIMENTS OF THE INVENTION

Now, the present invention is more specifically described with reference to accompanying drawings.

Embodiment

Figure 1A:
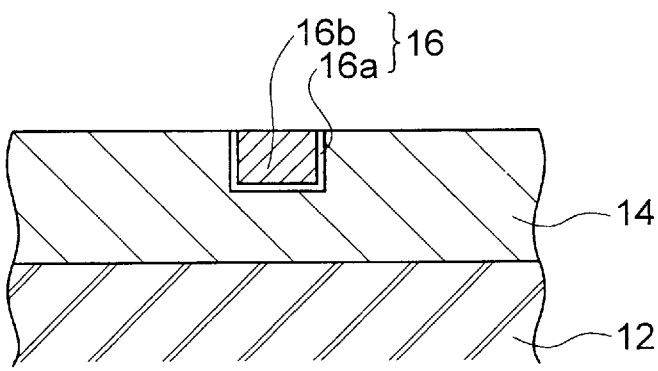
FIGS. 1A to 1H are longitudinal partial sectional views of a semiconductor device sequentially showing a conventional dual-damascene method for fabricating the semiconductor device.
Figure 1B:
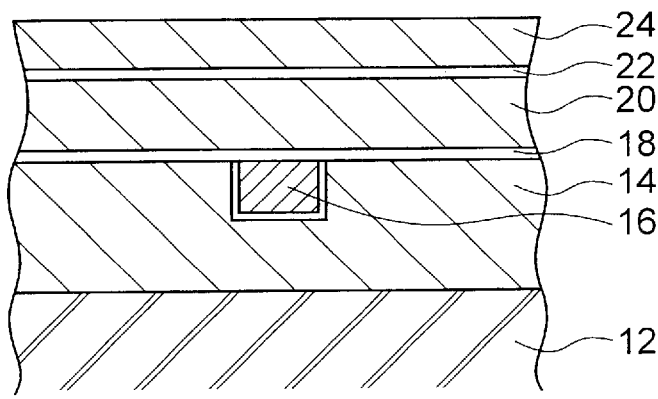
Figure 1C:
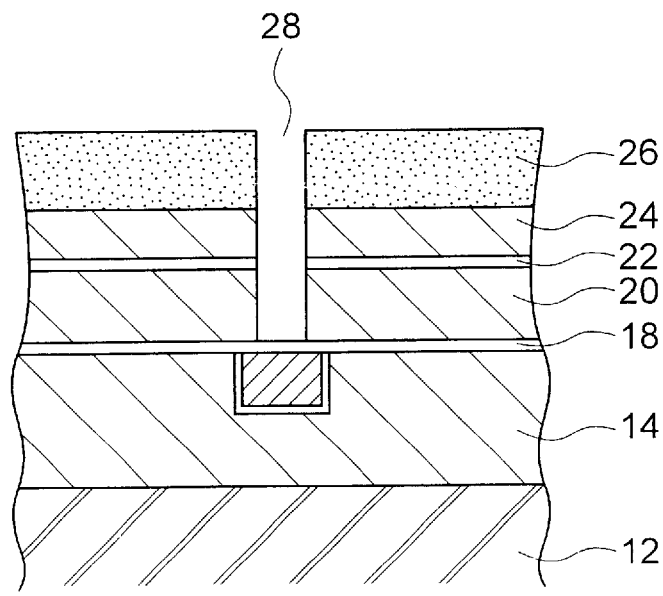
Figure 1D:
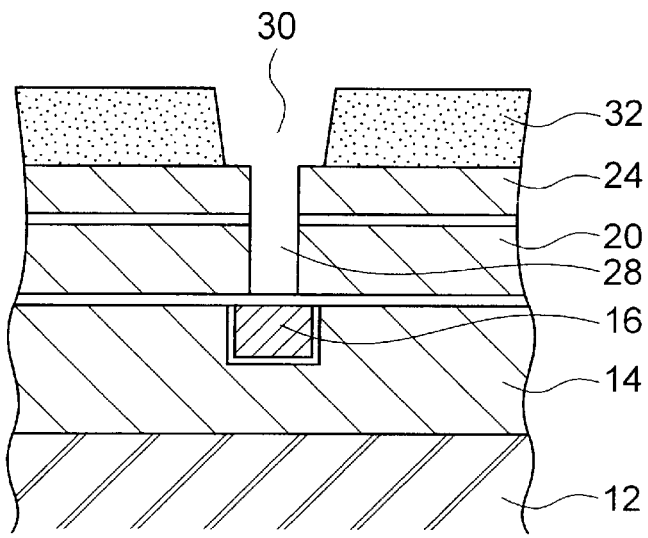
Figure 1E:
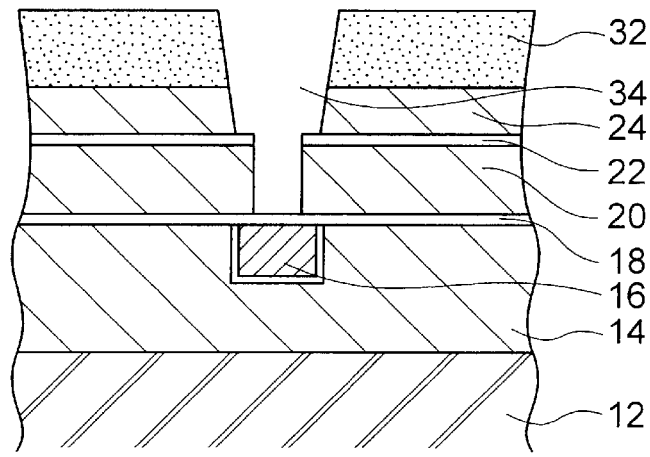
Figure 1F:
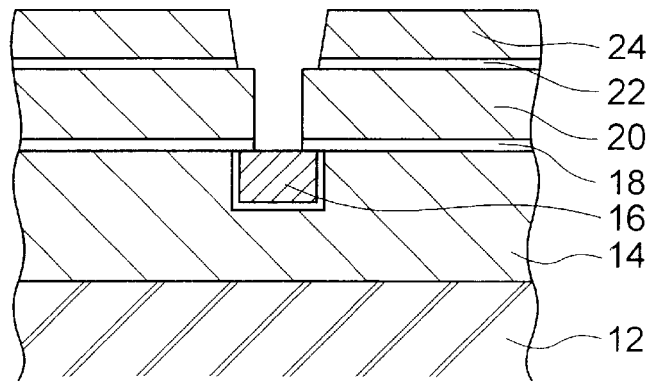
Figure 1G:
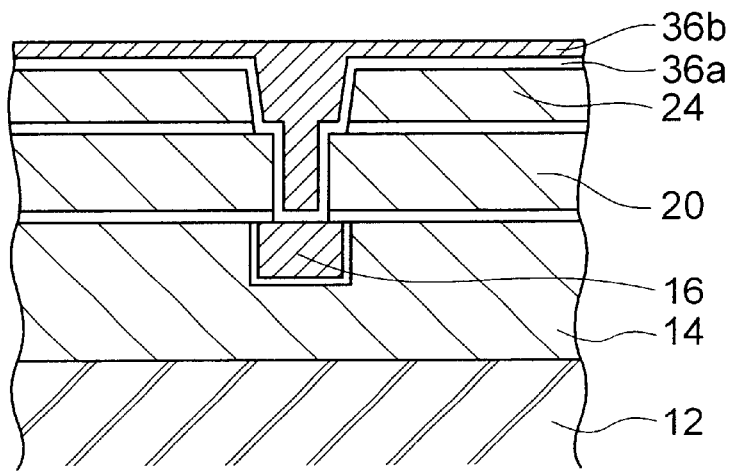
Figure 1H:
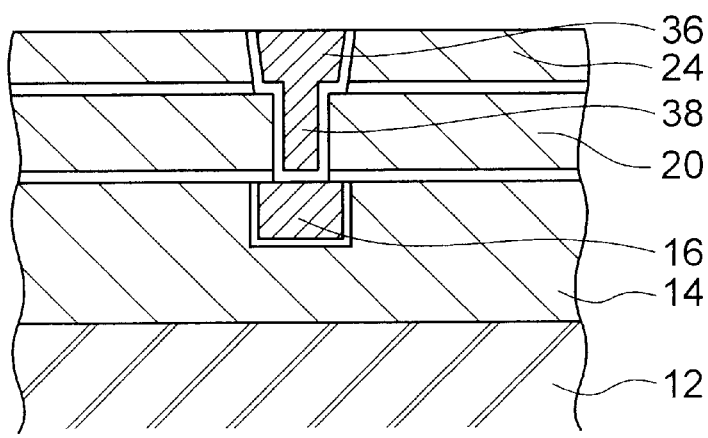
Figure 2A:
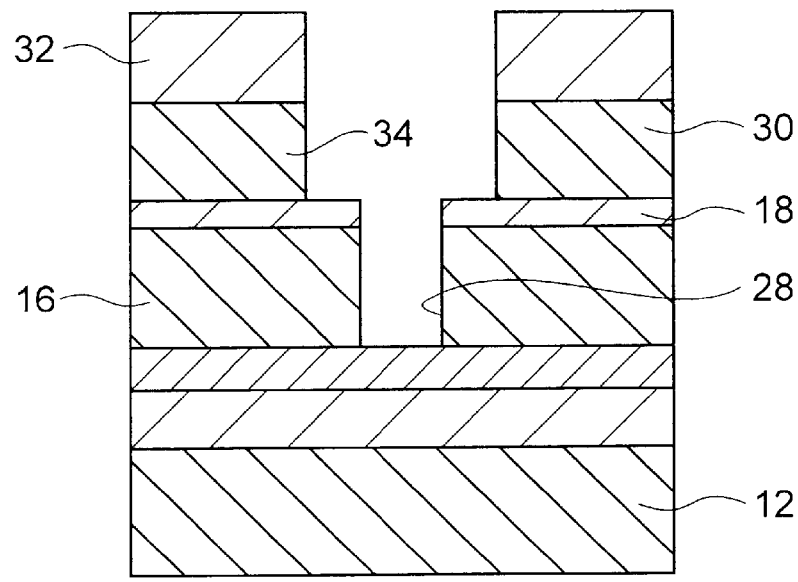
FIGS. 2A and 2B are longitudinal partial sectional views of the semiconductor device illustrating problems in the conventional dual-damascene method.
Figure 2B:
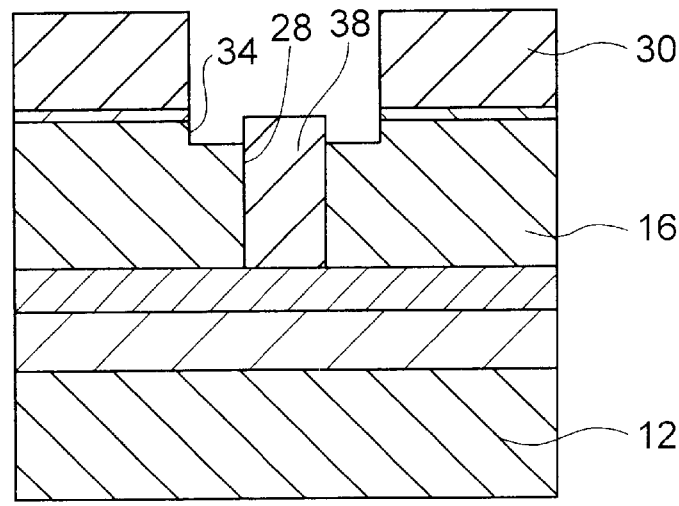
Figure 3A:
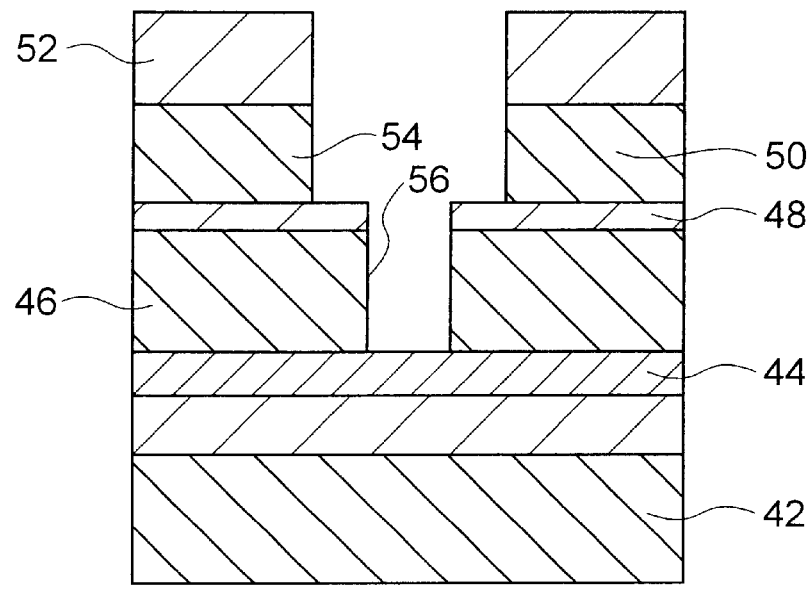
FIGS. 3A and 3B are longitudinal partial sectional views of a semiconductor device fabricated by another conventional dual-damascene method.
Figure 3B:
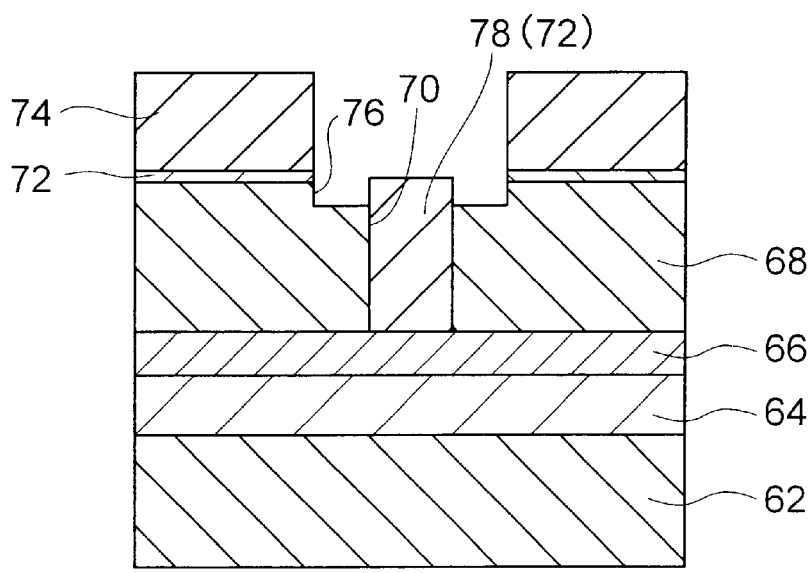
Figure 4A:
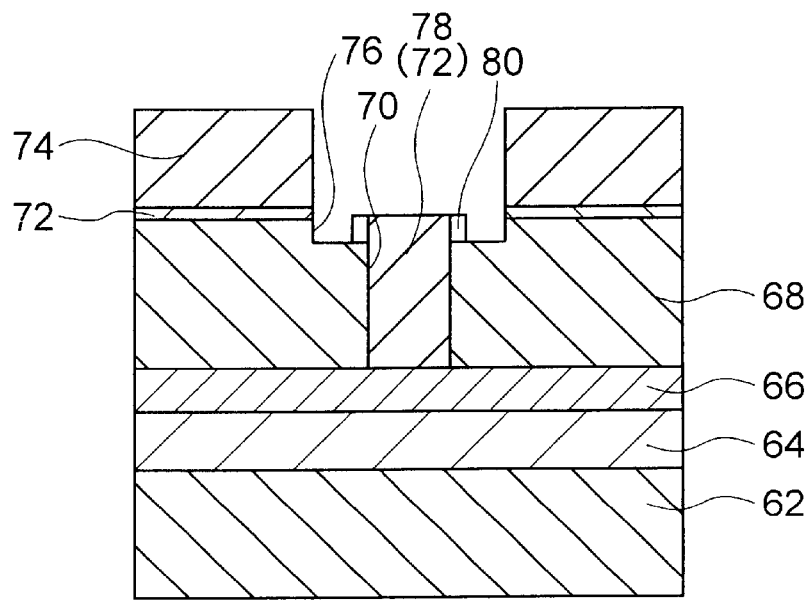
FIGS. 4A and 4B are longitudinal partial sectional views of the semiconductor device of FIGS. 3A and 3B illustrating problems in the conventional dual-damascene method.
Figure 4B:
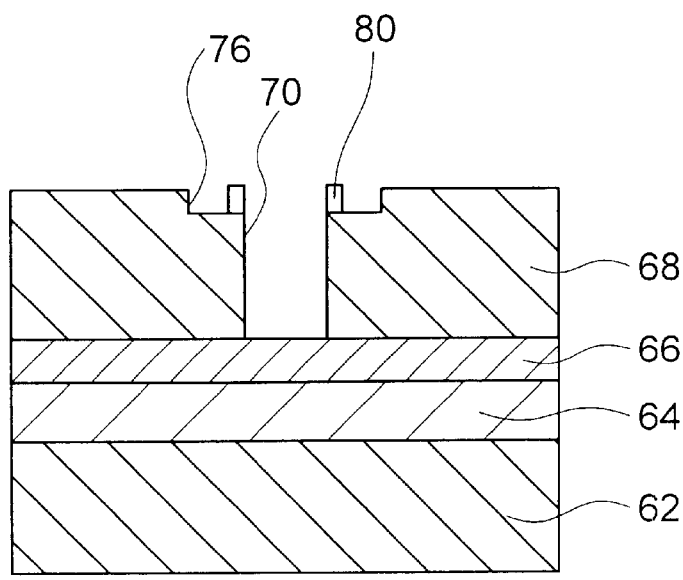
Figure 5A:
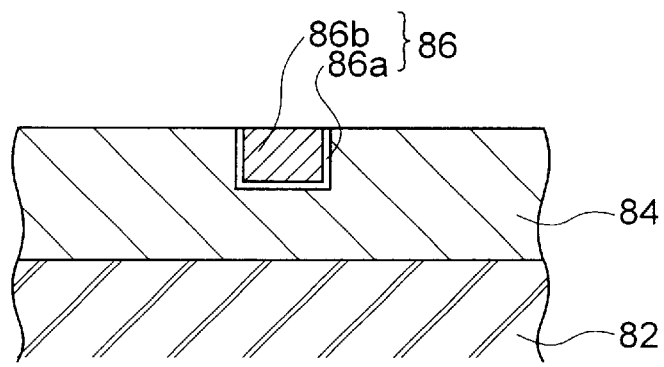
FIGS. 5A to 5K are longitudinal partial sectional views of a semiconductor device sequentially showing a dual-damascene method for fabricating the semiconductor device in accordance with an Embodiment of the present invention.

As shown in FIG. 5A, similarly to the above-described conventional method, after a dielectric film 84 formed by a $SiO_2$ film is deposited on a semiconductor substrate 82, an underlying interconnect 86 having a line width of 4000 Å is formed on the dielectric film 84 by using the damascene technology. The underlying interconnect 86 includes a barrier metal layer 86a formed by TiN having a thickness of 400 Å and a main interconnect 86b formed by Cu. The underlying interconnect 86 is formed by depositing a photoresist film on the dielectric film 84, forming an etching mask having a trench pattern by photolithographically treating the photoresist mask and etching the dielectric film 84.

Next, the barrier metal layer 86a and then the Cu layer 86b are deposited overlying the substrate by sputtering to fill the interconnect trench therewith. Thereafter, the Cu layer 86b and the barrier metal layer 86a on the dielectric film 84 are removed by using the CMP technology.

Figure 5B:
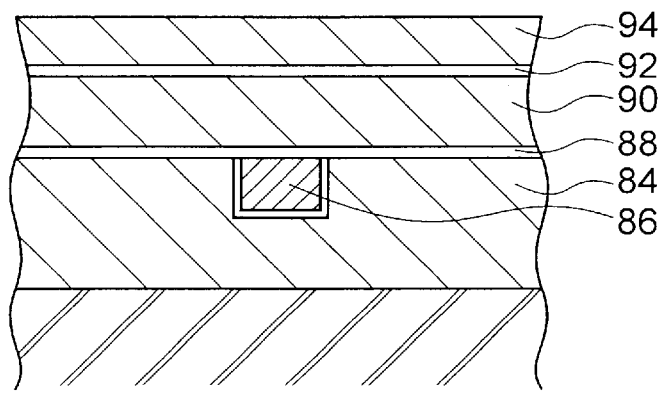

Then, as shown in FIG. 5B, in order to prevent the diffusion of the Cu in the underlying interconnect 86, a SiN film 88 having a thickness of 500 Å is formed overlying the entire surface of a substrate or on the dielectric film 84 and the underlying interconnect 86.

Thereafter, a $SiO_2$ film 90 having a thickness of 7000 Å and acting as an interlayer dielectric film, a SiON film 92 having a thickness of 500 Å and acting as an etch stop layer, and a $SiO_2$ film 94 having a thickness of 4000 Å and acting as a dielectric film for filling an overlying interconnect are sequentially formed overlying the entire surface of the substrate.

Figure 5C:
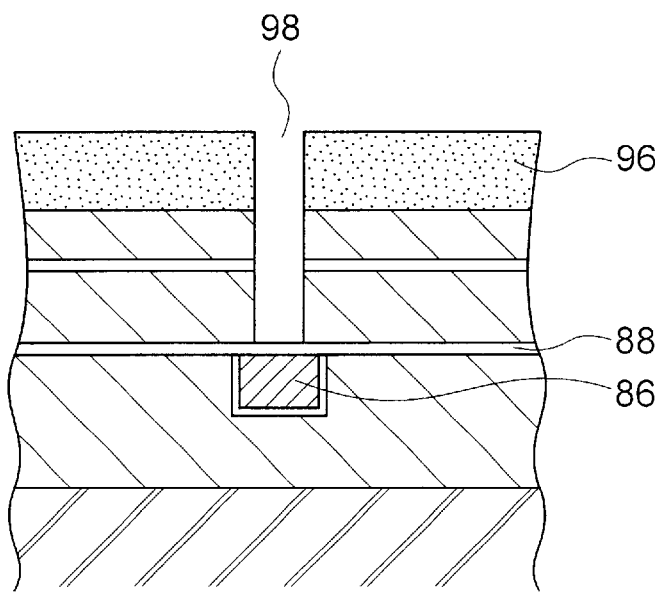

Then, a photoresist film is formed on the $SiO_2$ film 94 to form an etching mask 96 having a pattern for a through-hole in which the conductive via-plug is formed. Next, as shown in FIG. 5C, the $SiO_2$ film 94, the SiON film 92 and the $SiO_2$ film 90 are etched by using the anisotropic dry etching technology under the following conditions to form the through-hole 98 which exposes the SiN film 88 having a diameter between 0.2 and 0.5 $\mu$m. The underlying interconnect 86 is covered with the SiN film 88.

Conditions for Etching

Pressure: 2 Pa (15 mTorr)
Temperature: 20° C.
Etching Gas: $C_4F_3$/CO/Ar=1:4:12
Etching Rate of $SiO_2$ film: 4800 Å/min.

Figure 5D:
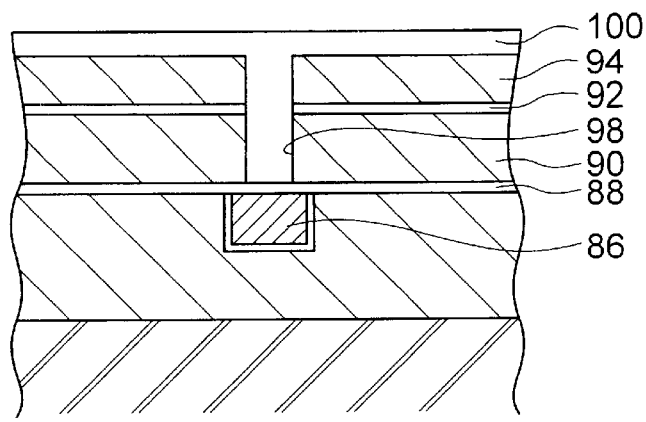

Then, after the removal of the etching mask 96, as shown in FIG. 5D, a protective film 100 formed by an organic film having the same composition as the reflection preventing film used for exposure is applied overlying the substrate such that the thickness thereof on the $SiO_2$ film 94 is 200 Å, thereby filling the through-hole 98 with a protective film plug. A reflection preventing film including polyimide resin or novolak resin as base resin, polyvinylphenol or polymethylmethacrylate as an additive, and a dye was used in the present Embodiment, as the protective film 100 or the protective film plug.

Figure 5E:
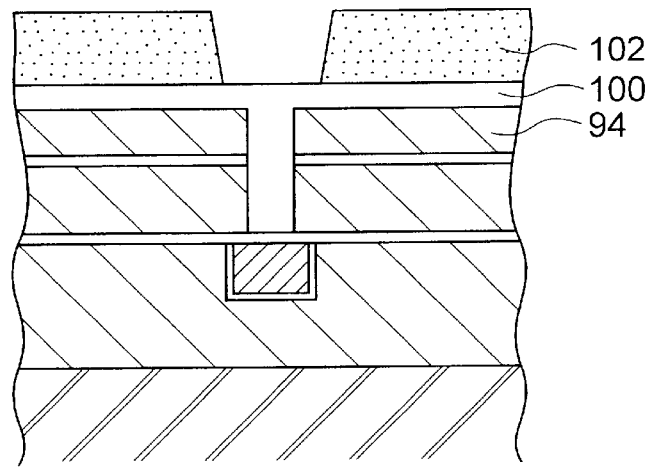

Then, as shown in FIG. 5E, a photoresist film having a thickness of 1 $\mu$m is deposited on the protective film 100, and an etching mask 102 having a trench pattern having a trench width of 0.3 $\mu$m is photolithographically formed.

Then, a protective film etching step is conducted in which the protective film 100 exposing from the etching mask 102 is etched by the anisotropic dry etching technology under the conditions the etching rate of the protective film 100 is higher than that of the $SiO_2$ film 94, for example, under the following conditions.

Figure 5F:
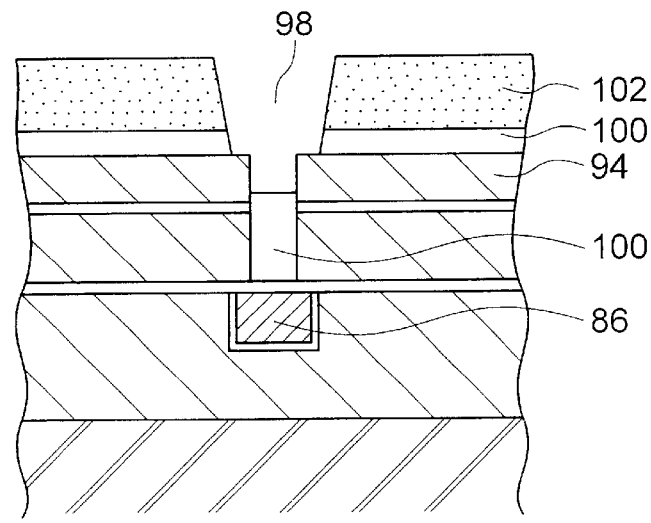

Thereby, as shown in FIG. 5F, the $SiO_2$ film 94 under the protective film 100 is exposed and the protective film plug in the through-hole 98 is etched such that the top surface of the protective film plug is lower than the top surface of the $SiO_2$ film 94 and is higher than the SiON film 92.

Conditions for Etching

Pressure: 2.7 Pa (20 mTorr)
Temperature: 20° C.
Etching Gas: $CF_4/O_2$/Ar=1:1:10
Etching Rate of $SiO_2$ film: 110 Å/min.
Etching Rate of protective film and protective film plug: 220 Å/min.

Then, a $SiO_2$ film etching step is conducted in which the $SiO_2$ film 94 exposing from the etching mask 102 is etched by the anisotropic dry etching technology under the conditions the etching rate of the protective film 100 and the protective film plug is lower than that of the $SiO_2$ film 94 by 10 to 20%, for example, under the following conditions.

Figure 5G:
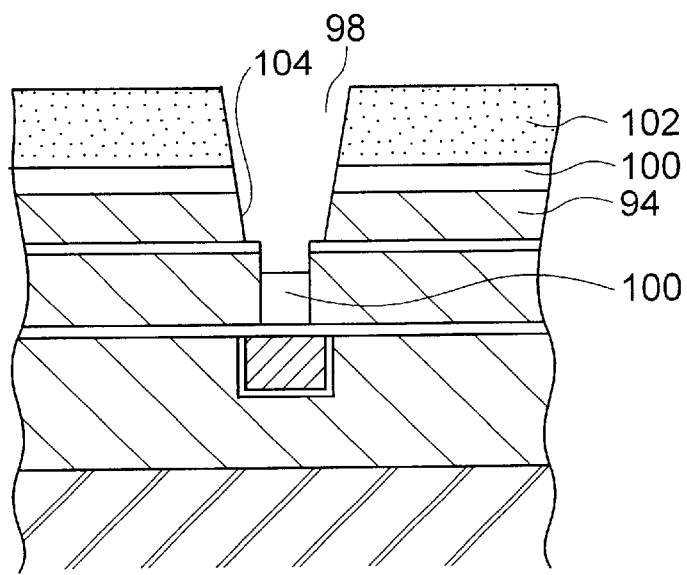

Thereby, as shown in FIG. 5G, an interconnect trench 104 is formed. In the etching step, the SiON film 92 acts as the etch stop layer, and the top surface of the protective film plug in the through-hole 98 is lower than the SiON film 92. The protective film 100 covers the SiN film 88.

Conditions for Etching

Pressure: 53.3 Pa (400 mTorr)
Temperature: 20° C.
Etching Gas: $CF_4$/Ar=1:5
Etching Rate of $SiO_2$ film: 6000 Å/min.
Etching Rate of protective film and the protective film plug: 5000 Å/min.

Figure 5H:
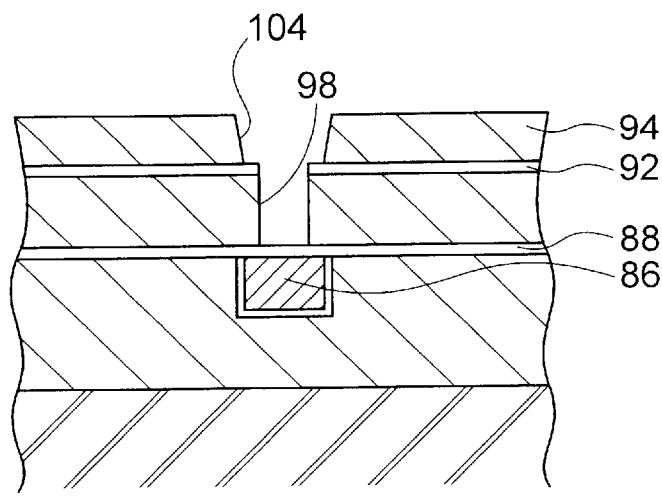

Then, the etching mask 102, the protective film 100 on the $SiO_2$ film 94, and the protective film plug in the through-hole 98 are removed by the ashing treatment to form, as shown in FIG. 5H, the through-hole 98 and the interconnect trench 104 communicating thereto, thereby exposing the SiN film 88 to the bottom of the through-hole 98.

Figure 5I:
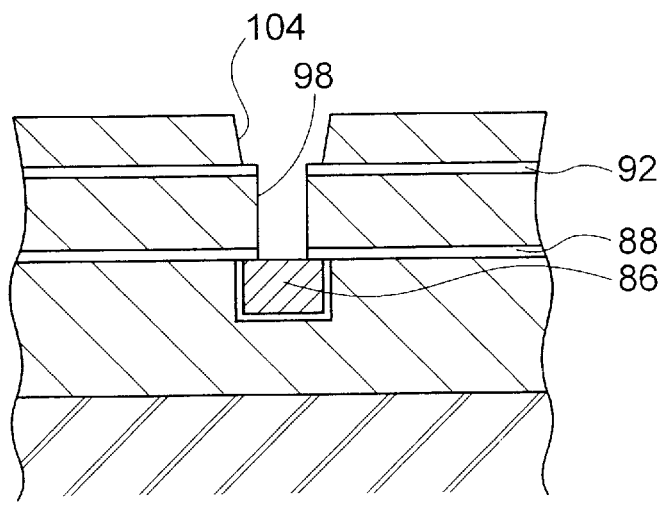

As shown in FIG. 5I, similarly to the conventional method, the exposed SiON film 92 is removed, and the SiN film 88 is further removed to expose the underlying interconnect 86.

Figure 5J:
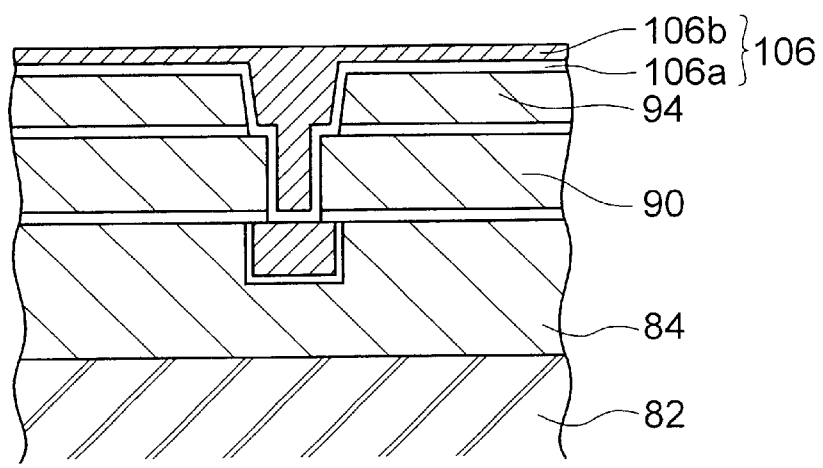

As shown in FIG. 5J, similarly to the conventional method, a barrier metal layer 106a formed by a TiN film having a thickness of 400 Å and a main interconnect 106b formed by Cu are formed on the wafer to fill the through-hole 98 and the interconnect trench 104.

Figure 5K:
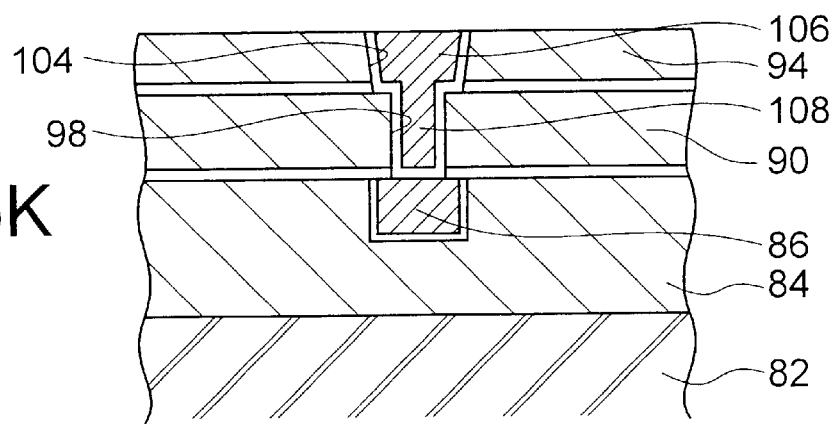

Then, as shown in FIG. 5K, the barrier metal layer 106a and the main interconnect layer 106b on the $SiO_2$ film 94 are removed by using the CMP process, thereby forming a conductive via-plug 108 in the through-hole 98 and an overlying interconnect 106 in the interconnect trench 104.

In this manner, the multi-layered interconnect structure including the underlying interconnect 86 and the overlying interconnect 106 connected to the underlying interconnect 86 through intermediary of the conductive via-plug 108 can be formed by using the dual-damascene technology which includes a lesser number of steps than the damascene technology.

Since the multi-layered interconnect structure fabricated by the method of the present Embodiment includes the through-hole 98 protected by the protective film plug, the aperture diameter is not increased. Further, since the SiN film 88 is covered with the protective film 100 until the final step of the etching when the etching mask 102 and the protective film 100 are removed by the ashing treatment, the etching of the SiN film 88 and the resulting exposure and the oxidation of the underlying interconnect 86 can be prevented different from the conventional method.

Since the through-holes 98 are filled with the protective film plug also in the region where the through-holes 98 are densely formed, the thinning of the photoresist film in the region having the densely distributed through-holes 98 does not occur when the photoresist film for the etching mask 102 is formed.

In the protective film etching step in the present Embodiment, the mixed gas such as $CF_4/O_2/Ar$ is used as the etching gas. However, any other mixed gas such as $C_4F_8/O_2/Ar$ can be used therein.

Further, as the barrier metal film, a Ta film having a thickness of 400 Å or a layered film including the TaN film having a thickness of 200 Å and the Ta film having a thickness of 200 Å may be used in place of the TiN film having the thickness of 400 Å.

Although the Cu is used in the main interconnect of the present Embodiment, another metal or alloy such as aluminum, aluminum alloy and tungsten may be used in place of the Cu. When the metal or the alloy other than the Cu is used in the main interconnect, the SiN film 88 for preventing the diffusion of the metal is not necessarily required.

In the present invention, the metal constituting the underlying interconnect, the conductive via-plug and the overlying interconnect is not especially restricted, and the metal such as Cu, Al and W or alloy of the meal can be used. A polycrystalline silicon interconnect may be used as the underlying interconnect. The interconnect may be formed by the barrier metal layer and the main interconnect. The former includes a TiN film, a Ta film and a layered film such as TaN film/Ta film, and the latter may be formed by the metal such as Cu, Al and W or alloy of the meal. In the step of filling the through-hole and the interconnect trench, at first, the etching stopper exposed to the interconnect trench may be removed.

In the method of the present invention, the underlying interconnect includes an impurity-diffused layer, or the underlying interconnect may be replaced with the impurity-diffused layer.

When an inorganic dielectric film such as a $SiO_2$ film, a BPSG film and a TEOS film is used as the second dielectric film, an organic film is used as the protective film and the protective film plug. For example, the protective film and the protective film plug are formed by using an organic material such as SiLK™ manufactured by the Dow Chemical Company which is preferably the same as that of the reflection preventing film used for the exposure. In the first protective film etching step, the etching gas includes fluorocarbon-based gas, oxygen gas and inert gas, and the second protective film etching step, the etching gas includes fluorocarbon-based gas and inert gas and does not include oxygen gas. The fluorocarbon-based gas includes $CF_4$ and $C_4F_8$.

When an organic dielectric film is used as the second dielectric film, an inorganic film is used as the protective film and the protective film plug.

Since the above embodiments are described only for examples, the present invention is not limited to the above embodiments and various modifications or alterations can be easily made therefrom by those skilled in the art without departing from the scope of the present invention.

What is claimed is:

1. A method for forming a multi-layered interconnect structure comprising the steps of:

depositing an underlying interconnect overlying a substrate;

consecutively depositing a first dielectric film, an etch stop layer and a second dielectric film on the underlying interconnect;

forming a through-hole penetrating the first dielectric film, the etch stop layer and the second dielectric film to expose a portion of the underlying interconnect;

depositing a protective film on the second dielectric film and a protective film plug in the through-hole;

etching the protective film and the protective film plug by using an etching mask in an etching condition such that the protective film has a larger etching rate compared to the second dielectric film, until the protective film plug has a top surface lower than a top surface of the second dielectric film;

etching the second dielectric film and the protective film by using the etching mask in an etching condition such that the second dielectric film has an etching rate not lower than an etching rate of the protective film plug, to form an interconnect trench in the second dielectric film while leaving a portion of the protective film plug;

removing the etching mask, the protective film and the protective film plug;

depositing an overlying interconnect in the interconnect trench and the through-hole to form the overlying interconnect connected to the underlying interconnect via the through-hole.

2. The method as defined in claim 1, wherein the plug in the through-hole is etched in the first etching step of the protective film such that the top surface of the protective film plug in the through-hole is placed between the top surface of the second dielectric film and the etch stop layer.

3. The method as defined in claim 1, wherein the protective film plug in the through-hole is etched in the first protective film etching step of the protective film such that the top surface of the protective film plug in the through-hole is placed lower than the top surface of the second dielectric film by a distance between ½ and ⅓ of the depth of the interconnect trench of the overlying interconnect.

4. The method as defined in claim 1, wherein, when an inorganic dielectric film is used as the second dielectric film, an organic film is used as the protective film and the plug; an anisotropic dry etching is conducted by using mixed gas including fluorocarbon-based gas, oxygen gas and inert gas in the first protective film etching step; and an anisotropic dry etching is conducted by using mixed gas including fluorocarbon-based gas and inert gas and including no oxygen gas in the second etching step of the protective film.

5. The method as defined in claim 1, wherein, when an organic dielectric film is used as the second dielectric film, an inorganic film is used as the protective film and the protective film plug; an anisotropic dry etching is conducted by using mixed gas including fluorocarbon-based gas and inert gas and including no oxygen gas in the first etching step of the protective film; and an anisotropic dry etching is conducted by using mixed gas including fluorocarbon-based gas, oxygen gas and inert gas in the second etching step of the protective film.

6. The method as defined in claim 4, wherein the organic film is formed by a material substantially the same as that for a reflection preventing film used for exposure.

7. The method as defined in claim 1, wherein a SiN film is formed, as a metal-diffusion preventing film, on the underlying interconnect formed by a metal or alloy of which a main component is copper and then the first dielectric film is formed.

8. The method as defined in claim 1, wherein a SiON film is formed as the etch stop layer for the second dielectric film formed by a $SiO_2$ film.

9. The method as defined in claim 1, wherein the underlying interconnect is an impurity-diffused layer.

* * * * *